United States Patent
Sedio

(10) Patent No.: US 9,554,470 B2
(45) Date of Patent: Jan. 24, 2017

(54) INTEGRATED ELECTRONIC ASSEMBLY FOR CONSERVING SPACE IN A CIRCUIT

(71) Applicant: Coilcraft, Incorporated, Cary, IL (US)

(72) Inventor: Stephen Michael Sedio, Valley Center, CA (US)

(73) Assignee: Coilcraft, Incorporated, Cary, IL (US)

( * ) Notice: Subject to any disclaimer, the term of this patent is extended or adjusted under 35 U.S.C. 154(b) by 0 days.

(21) Appl. No.: 14/572,348

(22) Filed: Dec. 16, 2014

(65) Prior Publication Data

US 2015/0098189 A1  Apr. 9, 2015

Related U.S. Application Data

(60) Continuation of application No. 12/695,583, filed on Jan. 28, 2010, now Pat. No. 8,945,948, which is a division of application No. 11/465,215, filed on Aug. 17, 2006, now Pat. No. 7,690,105.

(60) Provisional application No. 60/709,491, filed on Aug. 19, 2005.

(51) Int. Cl.
| | |
|---|---|
| *H05K 1/18* | (2006.01) |
| *H01L 21/00* | (2006.01) |
| *H05K 1/11* | (2006.01) |
| *H05K 5/00* | (2006.01) |
| *H05K 7/00* | (2006.01) |
| *H05K 7/20* | (2006.01) |
| *H05K 3/34* | (2006.01) |

(52) U.S. Cl.
CPC ............. *H05K 1/183* (2013.01); *H05K 1/181* (2013.01); *H05K 5/0095* (2013.01); *H05K 7/005* (2013.01); *H05K 7/20127* (2013.01); *H05K 3/341* (2013.01); *H05K 2201/1003* (2013.01); *H05K 2201/10015* (2013.01); *H05K 2201/10166* (2013.01); *H05K 2201/10515* (2013.01); *H05K 2201/10537* (2013.01); *H05K 2201/10636* (2013.01); *H05K 2201/10689* (2013.01); *Y02P 70/611* (2015.11); *Y10T 29/4902* (2015.01); *Y10T 29/4913* (2015.01); *Y10T 29/49073* (2015.01); *Y10T 29/49105* (2015.01)

(58) Field of Classification Search
USPC ............... 235/492; 365/2; 257/679; 361/600
See application file for complete search history.

(56) References Cited

U.S. PATENT DOCUMENTS

| | | | |
|---|---|---|---|
| 4,165,535 A | * | 8/1979 | Mortelmans ......... G11C 19/085 365/2 |
| 5,083,236 A | | 1/1992 | Chason |
| 5,386,343 A | | 1/1995 | Pao |
| 5,994,768 A | | 11/1999 | Fogelson |
| 6,191,480 B1 | | 2/2001 | Kastberg |

(Continued)

*Primary Examiner* — Daniel Hess
(74) *Attorney, Agent, or Firm* — Fitch, Even, Tabin & Flannery LLP

(57) ABSTRACT

An integrated electronic assembly including a first electronic component defining a receptacle and at least a second electronic component wherein at least a portion of the second electronic component is disposed in the receptacle of the first electronic component, and a method for conserving space in a circuit or on a printed circuit board by integrating a plurality of electronic components so that the plurality of electronic components collectively take up a smaller amount of space on a substrate than the plurality of electronic components would if the plurality of electronic components were not integrated.

8 Claims, 3 Drawing Sheets

(56) References Cited

U.S. PATENT DOCUMENTS

| | | | |
|---|---|---|---|
| 6,239,752 B1 * | 5/2001 | Blanchard | H01Q 1/002 |
| | | | 343/702 |
| 6,268,796 B1 * | 7/2001 | Gnadinger | G06K 19/0726 |
| | | | 257/673 |
| 6,381,837 B1 | 5/2002 | Baker | |
| 6,459,593 B1 | 10/2002 | Kwong | |
| 6,461,895 B1 | 10/2002 | Liang | |
| 6,486,398 B1 | 11/2002 | McCulloch | |
| 6,690,255 B2 | 2/2004 | Caramela | |
| 6,717,500 B2 | 4/2004 | Girbachi | |
| 6,877,211 B2 | 4/2005 | Machado | |
| 6,914,506 B2 | 7/2005 | Gallup | |
| 7,690,105 B2 | 4/2010 | Sedio | |
| 7,816,774 B2 | 10/2010 | Dekker | |
| 8,945,948 B2 | 2/2015 | Sedio | |
| 2002/0123159 A1 | 9/2002 | Chi | |
| 2002/0164892 A1 | 11/2002 | Girbachi | |
| 2003/0043996 A1 | 3/2003 | Sedio | |
| 2003/0156002 A1 | 8/2003 | Caramela | |
| 2003/0190039 A1 | 10/2003 | Sedio | |
| 2004/0252825 A1 | 12/2004 | Sedio | |
| 2004/0263306 A1 | 12/2004 | Gallup | |
| 2005/0116801 A1 | 6/2005 | Proehl | |
| 2006/0001138 A1 | 1/2006 | Sakama | |
| 2008/0029907 A1 | 2/2008 | Koduri | |

* cited by examiner

US 9,554,470 B2

INTEGRATED ELECTRONIC ASSEMBLY FOR CONSERVING SPACE IN A CIRCUIT

CROSS-REFERENCE TO RELATED APPLICATION

This application is a continuation of prior application Ser. No. 12/695,583, filed Jan. 28, 2010, which is a divisional of prior application Ser. No. 11/465,215, filed Aug. 17, 2006, and claims benefit of U.S. Provisional Application No. 60/709,491, filed Aug. 19, 2005, which are hereby incorporated herein by reference in their entirety.

FIELD OF THE INVENTION

This invention relates generally to electronic components and more particularly concerns integrated electronic assemblies for conserving space in a circuit or on a substrate.

BACKGROUND OF THE INVENTION

The electronics industry is continually called upon to make products smaller and more powerful. Applications such as mobile phones, portable computers, computer accessories, hand-held electronics, etc., create a large demand for smaller electronic components. These applications further drive technology to research new areas and ideas with respect to miniaturizing electronics and often require "low profile" components due to constraints in height and width. Unfortunately, the technology is often limited due to the inability to make certain circuits and components smaller, faster, or more powerful. Nowhere can this be seen more than in the struggle to manufacture smaller electronic circuits and components which take up less space on a substrate, such as a printed circuit board ("PCB").

Originally, individual components had to be mounted on a PCB by inserting the leads of the component through holes in the PCB and soldering them to solder pads on the opposite side of the PCB, (called through-hole technology). This technique left half of the PCB unpopulated because one side had to be reserved for solder pads and solder and required enough space on the PCB to mount each individual component. Therefore, in order to fit more components in a particular circuit, the PCBs were made larger, or additional PCBs were required. Many times, however, these options were not available due to constraints in size for the PCBs.

A solution to this problem came in the form of Surface-Mount Devices ("SMD"), or Surface-Mount Technology. SMDs allow electronic devices or components to be mounted on one side of a substrate, (i.e., without having leads inserted through holes in the substrate). An SMD device has small metalized pads (solder pads, terminals or leads) connected to its body, which correspond to solder pads or lands placed on the surface of the substrate. Typically the substrate is run through a solder-paste machine, such as a screen printer, which puts a small amount of solder on the substrate lands. Then, the component is placed on the substrate, and the substrate and SMD device are sent through a re-flow oven to heat the solder paste and solder the component leads to the substrate lands ("reflow soldering"). The primary advantage to this technique is that both sides of the substrate can now be populated by electronic components. Meaning one substrate today can hold an amount of electronic components approximately equal to two substrates in the past.

Another solution to this problem was the development of the integrated circuit ("IC"), which allowed circuits made up of multiple electronic components to be combined into one packaged component. This allowed more components to be mounted on a substrate and reduced the amount of substrate space used (and therefore needed) by replacing multiple individual electronic components with one IC package. This also lowered manufacturing times for assembling electronics by reducing the number of components that had to be mounted to the substrate. Today, substrates continue to be populated with ICs and individual electronic components that have not been incorporated into an IC package ("discrete components").

As a result of these advances in technology, current electronic circuits are mainly limited by the size and number of components needed to be used on the PCB. Meaning, if the electronic components are made smaller or fewer components are needed for a particular circuit, the circuit can be made smaller as well. Unfortunately, there are some electronic components that a circuit cannot due without and that cannot be produced any smaller than they currently are without sacrificing something, (e.g., performance, structural integrity, etc.). Usually this is because the desired parameters for the component cannot be achieved when using smaller parts. Good examples of this are coil components, such as for example, inductors, antennas, transformers, chokes and the like. Certain parameters of these components are affected by the size of the parts used. For instance, in inductors, wire gauge determines both the DC resistance and the current carrying ability of the component. In other examples, the component may be capable of being made in a smaller size, but incapable of performing comparably to the original larger version of the component, (e.g., with comparable inductance, frequency range, Q-value, self-resonant frequency, or the like).

Accordingly, it has been determined that the need exists for an improved electronic component which overcomes the aforementioned limitations and which further provides capabilities, features and functions, not available in current devices and for a method of conserving space in a circuit.

DESCRIPTION OF THE PREFERRED EMBODIMENTS

An integrated electronic assembly in accordance with the invention includes a first electronic component and at least a second electronic component wherein the first electronic component defines a receptacle, such as a recess or opening, into which at least a portion of the second electronic component is disposed. Once the second electronic component is disposed in the opening of the first electronic component, the first and second electronic components collectively form an integrated electronic assembly which may be connected to a substrate, such as a PCB, as a single component or assembly or within the footprint of a single component as will be discussed further below.

In a preferred form, the first electronic component has a footprint of a specified size for mounting the first electronic component to the PCB and defines a sufficient opening so that the second electronic component can be mounted to the PCB within the footprint of the first electronic component. The first electronic component may be a discrete component, such as a coil component, which defines an opening into which a second electronic component, such as an IC or, alternatively, another discrete component, is inserted. For example, in one form, the first electronic component may be a magnetic component, such as an inductor, which defines an opening for receiving at least a portion of a second discrete component, such as a capacitor. In another form, the first electronic component may consist of another discrete component which defines an opening for receiving at least a portion of an IC. In still other forms, the first electronic component may define a receptacle capable of receiving two or more additional electronic components, such as for example, both an additional discrete component and an IC.

Figure 1A:
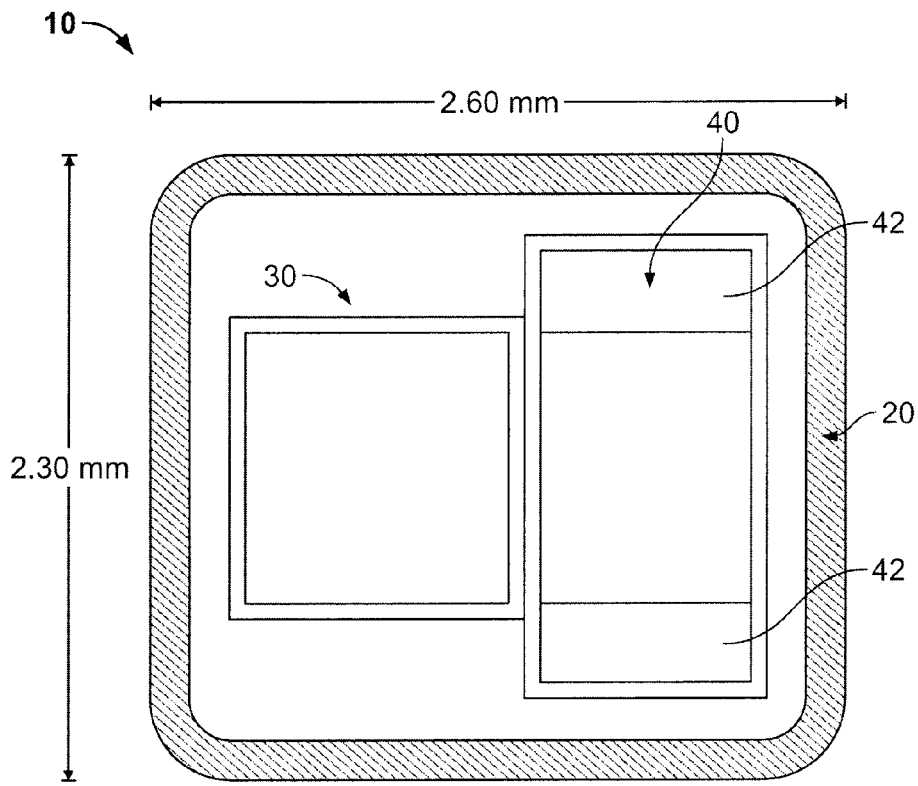
FIG. 1A is a plan view of an integrated electronic assembly according to the invention with the top of the body removed so that the second and third electronic components located within the first electronic component are visible.
Figure 1B:
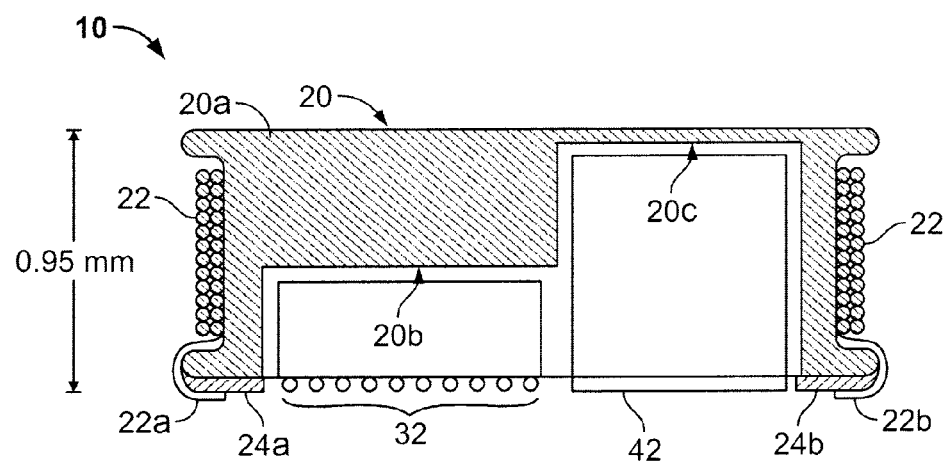
FIG. 1B is a side elevational view of the integrated electronic assembly of FIG. 1, with the first electronic component shown in cross-section so that the second and third electronic components are visible.
Figure 2A:
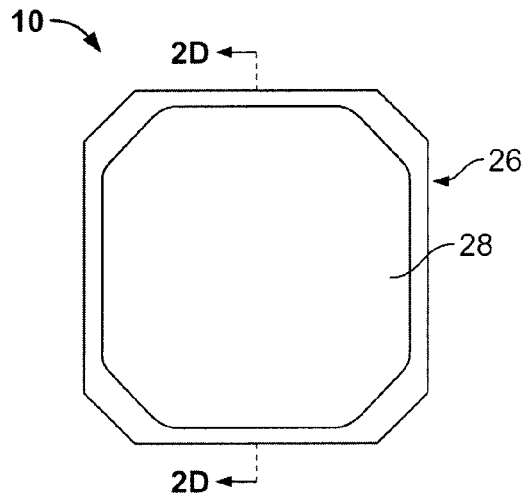
FIG. 2A is a plan view of an alternate first electronic component for use in an integrated electronic assembly according to the invention, shown without the wire winding for purposes of clarity.
Figure 2D:
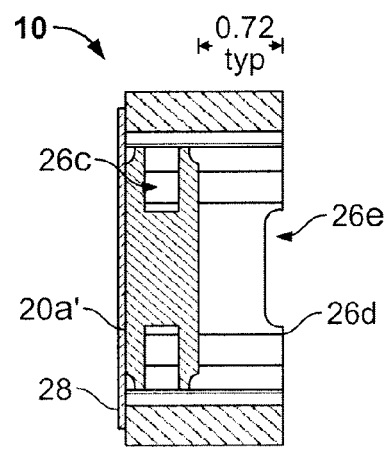
FIG. 2D is a cross sectional view of the first electronic component of FIG. 2A taken along line 2D-2D in FIG. 2A.
Figure 2B:
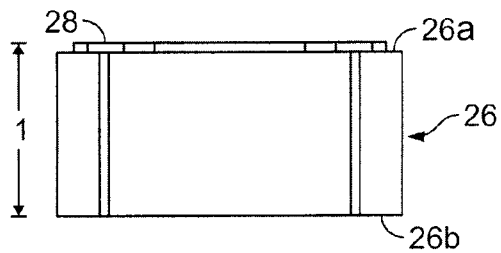
FIG. 2B is a side elevational view of the first electronic component of FIG. 2A.
Figure 2C:
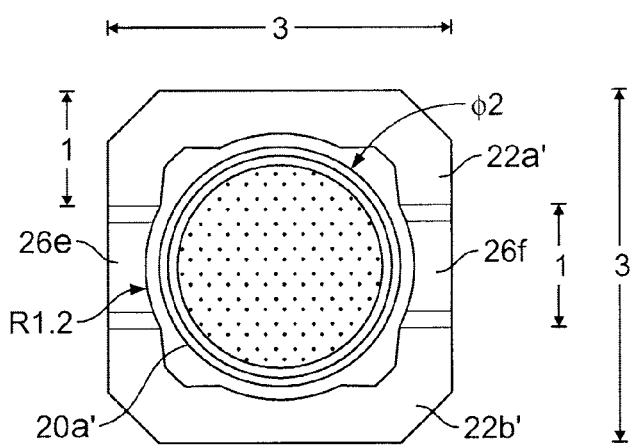
FIG. 2C is a bottom view of the first electronic component of FIG. 2A.
Figure 3A:
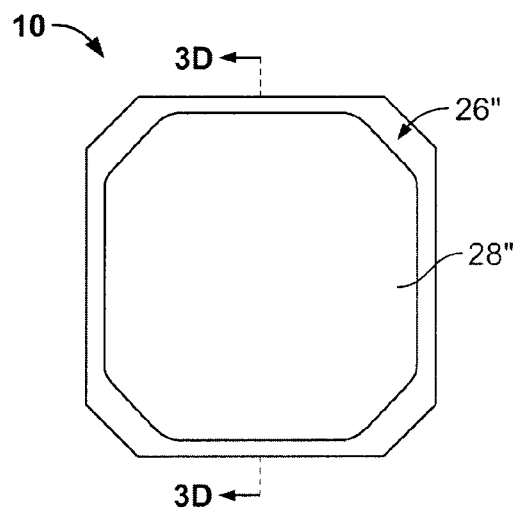
FIG. 3A is a plan view of an alternate first electronic component for use in an integrated electronic assembly according to the invention.
Figure 3D:
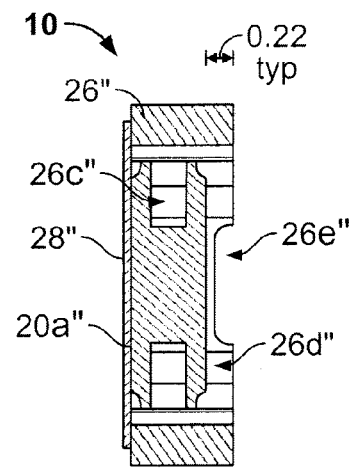
FIG. 3D is a cross sectional view of the first electronic component of FIG. 3A taken along line 3D-3D in FIG. 3A.
Figure 3B:
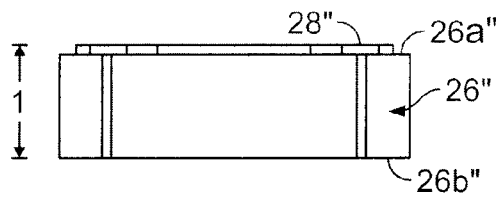
FIG. 3B is a side elevational view of the first electronic component of FIG. 3A.
Figure 3C:
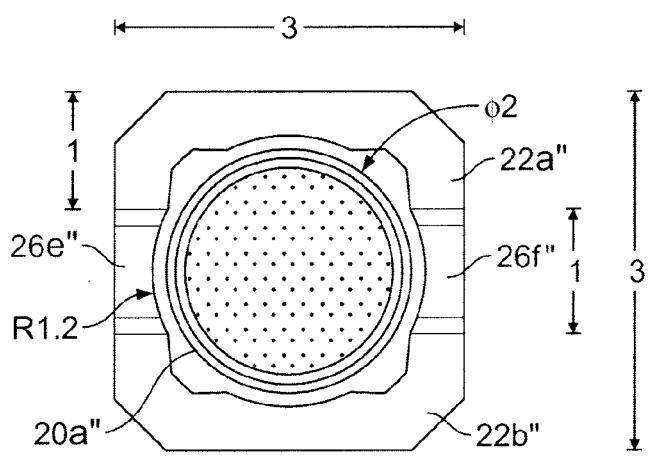
FIG. 3C is a bottom view of the first electronic component of FIG. 3A.

Turning now to FIGS. 1A-B, there is illustrated an integrated electronic assembly 10 embodying features of the present invention. The integrated electronic assembly 10 includes a first electronic component, such as inductor 20, a second electronic component, such as IC 30, and a third electronic component, such as capacitor 40. Although the embodiment illustrated uses a discrete component as the first electronic component and both an IC and an additional discrete component as the second and third electronic components, it should be understood that any combination of discrete components and/or ICs may be used to form an integrated electronic assembly in accordance with the invention.

In FIGS. 1A-B, the first electronic component 20 is an inductor having a body, such as form or core 20a, about which a conductive element, such as wire 22, is wound to form a coil through which current may be carried. The core 20a is preferably made of a high temperature plastic material or a magnetic material, such as ferrite, and defines a receptacle for receiving at least a second electronic component. For example, in the embodiment illustrated, the core 20a defines a first receptacle, such as first opening 20b, for receiving the second electronic component 30 and a second receptacle, such as second opening 20c, for receiving the third electronic component 40. In this form, the first and second openings 20b-c defined by the first electronic component 20 collectively form a single opening in the first electronic component 20 for receiving at least a portion of the second and third electronic components, 30 and 40 respectively.

In FIGS. 1A-B, the core 20a has a bobbin structure including a cylindrical center section with upper and lower flanges or flanged ends, respectively, extending from the ends of the center section. Although the core illustrated is symmetrical, it should be understood that a variety of different cores may be used, including asymmetrical cores, (e.g., cores having one flanged end that is larger in diameter than the other flanged end, etc.).

In the embodiment illustrated, metalized pads, such as solder pads 24a-b, are connected to the body 20a and provide terminals by which the first electronic component 20 may be connected into a circuit. The metalized pads 24a-b are made of a conductive material and are preferably fused or bonded to the body 20a so that the first electronic component 20 may be electrically and mechanically attached to corresponding lands located on the PCB via solder. More particularly, the metalized pads 24a-b provide an electrically conductive surface to which the solder paste printed on the PCB can bond once the first electronic component 20 and PCB are passed through a reflow oven. As is depicted in FIG. 1, the metalized pads 24a-b are preferably located on the bottom of the body 20a. It should be understood, however, that metalized pads of different shapes and sizes may alternatively be used and that the metalized pads 24a-b may be placed in alternate locations about the body 20a if desired. For example, the metalized pads 24a-b may alternately be L-shaped or U-shaped pads that wrap around the sides of the body 20a of first electronic component 20. In yet other forms, the metalized pads 24a-b may be provided as clips which are connected to the first electronic component 20 rather than being pads fused or bonded onto the body 20a thereof.

In a preferred embodiment, the wire 22 is an insulated wire such as a forty-two gauge (42 AWG) copper wire having ends 22a and 22b connected to the bottom of the metalized pads 16. It should be understood, however, that any conductive material may be used for the wire and that the wire size may be selected from a variety of wire gauges. For example, a preferred component may use wire ranging from thirty-two gauge wire to forty-eight gauge wire (32-48 AWG), while alternate components use wires of different wire gauges.

The ends of the wire 22a-b are preferably flattened (not shown) and bonded to the metalized pads 24a-b in order to minimize the amount of space between the lower surface of the metalized pads 24a-b and the upper surface of the corresponding substrate lands. This helps maintain the low profile of the assembly 10 and also helps ensure that the component will remain co-planar when positioned on the substrate so that the pads 24a-b and wire ends 22a-b will make sufficient contact with the solder on the substrate and make solid electrical and mechanical connections to the circuit on the substrate.

In alternate embodiments, the wire ends 22a-b may be connected to the inner or outer side surfaces of L-shaped, U-shaped or clip-type metalized pads, in order to avoid disrupting the flat bottom surface of pads 24a-b and in order to avoid increasing the height of the assembly 10 and/or creating a gap between any portion of the pads 24a-b and the corresponding substrate lands. In yet other embodiments, notches or dimples may be present in the lower surfaces of the body 20a and/or pads 24a-b in order to provide a designated location for the wire ends 22a-b to be bonded to the pads 24a-b without raising the height of the assembly 10 or creating a gap between the pads 24a-b and corresponding substrate lands.

In the embodiment illustrated, a single wire 22 is wound about the center section of the core 20*a*. It should be understood however, that in alternate embodiments, multiple wires may be used depending on the type of component the first electronic component is. For example, in an alternate embodiment wherein the first electronic component 20 is a transformer, multiple wires may be used and wrapped around the body 20*a*. In such embodiments, the component 20 will also include more than two metalized pads for the ends of the wire 22 to be connected to.

In FIGS. 1A-B, the second electronic component 30 is shown as an IC and the third electronic component 40 is shown as another discrete electronic component, such as a capacitor. The IC 30 may contain any number of active and/or passive components which are constructed on a substrate, such as semiconductor wafers (e.g., silicon, gallium arsenide or the like), glass substrates, insulative substrates or any other conventional IC material, and both the IC 30 and capacitor 40 may be of a variety of different sizes and shapes. In the form illustrated, both the IC 30 and capacitor 40 have metalized pads, 32 and 42 respectively, for electrically connecting the second and third components 30 and 40 into the substrate circuit. For example, the metalized pads or pins 32 of IC 30 may be aligned with and soldered to corresponding lands on the substrate in order to connect the IC 30 to the circuit on the substrate. Similarly, the metalized pads 42 of capacitor 40 may be aligned with and soldered to corresponding lands on the substrate in order to connect the capacitor 40 into the circuit on the substrate.

In FIGS. 1A-B, the inductor 20, IC 30 and capacitor 40 make up a portion of a power supply circuit. Thus, in this form, some or all of the power supply components are capable of being disposed or housed inside the inductor 20, which is typically the largest component in a low power switching regulator. In other embodiments, the assembly 10 may be designed so that all or most of the other power supply components are placed inside the first electronic component 20. Thus, this configuration may be used to reduce the size of switching power supplies while allowing the switching power supplies to provide higher power density.

As mentioned above, the assembly 10 may be provided as a single module with the first, second and third electronic components, 20, 30 and 40 respectively, already connected to one another (i.e., a pre-connected configuration). The connection between the components, 20, 30 and 40, may either be a simple mechanical one wherein the components are held together but are not electrically connected, or may be an electro-mechanical one wherein the components are held together and are electrically connected to one another to create a circuit. With a mechanical connection, the components may be mechanically connected to one another via an adhesive or other conventional method for connecting electronic components or their parts. With an electro-mechanical connection, the components may be wired together in addition to being secured into position via an adhesive or the components may be connected to their own substrate having traces electrically connecting the components into a circuit. Regardless of which type of pre-connection configuration is used, however, the assembly 10 will be capable of being placed as a single module or part rather than requiring the placement of the individual components.

Alternatively, the components 20, 30 and 40 may simply be provided apart from one another (i.e., an unconnected configuration) and assembled by the circuit manufacturer into the integrated electronic assembly 10 by placing one component after the other until the assembly 10 is complete.

In a preferred form, however, the assembly 10 will be provided in a pre-connected configuration wherein the components are mechanically connected to one another, but not electrically connected to one another. This configuration provides the circuit designer with flexibility in deciding how to interconnect the components of the assembly 10 and eliminates or greatly reduces the volume, cost and reduced reliability of using an additional or duplicate substrate to electro-mechanically connect the components. This configuration also reduces the number of components that must be placed on the substrate in order to complete the circuit and, thus, should result in faster more efficient manufacturing. For example, an electronic device manufacturer's PCB may be designed to provide lands and traces that correspond to the metalized pads of the electronic components 20, 30 and 40, so that the assembly can simply be picked and placed on the substrate as a single module and electrically connected to the circuit via reflow soldering. This configuration also conserves space on the overall circuit by mounting multiple electronic components within the footprint of a single component.

If the assembly 10 is to be provided in either the mechanically connected configuration or the electro-mechanical configuration, the components 20, 30 and 40 will be assembled by aligning the components in their proper x, y and z axis to ensure correct location/positioning and to ensure co-planarity of their respective metalized pads 22*a*-*b*, 32 and 42. Then, in a preferred form, the components will be connected or secured to one another using materials suitable for maintaining component alignment before, during and after reflow soldering. The assembly 10 may then be inspected and tested to ensure proper operation and construction, if desired.

If the assembly 10 is to be provided in an unconnected configuration, the components 20, 30 and 40 will be assembled via conventional pick-and-place equipment and the components will be electrically connected to one another via the corresponding lands and traces of the substrate. In a preferred form, the electronic components located within the receptacle of the first electronic component will be mounted on the substrate first and then the first electronic component will be mounted to the substrate. Although this configuration does not reduce the number of components that are placed on the substrate, it does conserve space in the substrate circuit by mounting multiple electronic components within the footprint of one single component.

Although the embodiment illustrated in FIGS. 1A-B and discussed above shows the assembly 10 made up of three separate components, it should be understood that the assembly 10 may alternately be made up of two components or, in yet other embodiments, may be made up of more than three components if desired. In addition, although the application discussed above is for a power supply component (e.g., a power switching regulator), it should be understood that the concept of an integrated electronic assembly in accordance with the invention may be used in any application where space is critical, such as for example, in portable electronics, hand-held electronics, cell phones, digital cameras, music and video players, laptops, LED flashlights, and the like.

Turning now to FIGS. 2A-D, there is illustrated an alternate embodiment of the first electronic component 20 of integrated electronic assembly 10. In this embodiment, an outer body or base is used in connection with the first electronic component 20, with the outer body or base defining (at least in part) the receptacle into which any additional electronic components are disposed. For convenience, features of alternate embodiments illustrated in FIGS. 2A-D that correspond to features already discussed with respect to FIGS. 1A-B are identified using the same reference numeral in combination with an apostrophe or prime notation (') merely to distinguish one embodiment from the other, but otherwise such features are similar.

In the alternate embodiment of electronic component 20 illustrated, (hereinafter component 20'), the first electronic component 20' includes an outer body or base 26 which is made of an insulating material, such as a non-conductive plastic or ceramic. In the form illustrated the base 26 has a polygonal shape and has smooth planer top 26a and bottom 26b surfaces. The base 26 further defines an opening or recess 26c for receiving at least a portion of core 20a' and defines a receptacle 26d for receiving any additional electronic components such as second and third electronic components 30 and 40. In the form illustrated, the recess or opening 26c and receptacle 26d are formed by the aperture through the base 26. Thus, both the core 20a' and base 26 define the boundary of receptacle 26d. However, it should be understood that in alternate embodiments the base 26 may be provided with a separate and distinct recess 26c and receptacle 26d, if desired. For example, in an alternate embodiment, a wall or partition may be used to separate the recess 26c and receptacle 26d from one another. It should also be understood that in alternate embodiments the base 26 may be provided in a different shape, such as for example in a generally rectangular shape or in a generally round or circular shape.

In the embodiment illustrated in FIGS. 2A-D, the side wall of base 26 that defines recess 26c has a radius of curvature and diameter which corresponds to or compliments the radius of curvature and diameter of the flanged ends of core 20a'. In a preferred form, the flanged ends of core 22a' fit loosely within the recess 26c so that space is provided between the outer edge of the flanged ends and the inner side wall of base 26, which allows the core 22a' to be installed into the base 26 more easily. In addition, the core 22a' is positioned such that the top of the core's upper flanged end is about even, or coplanar, with the top surface 26a of base 26, which helps provide a generally flat upper surface with which the component 20 may be picked up and placed on a substrate circuit.

In the form shown, the pieces of the first electronic component 20', such as the base 26 and core 22a', are held together via a film layer, such as adhesive tape 28, which may be positioned over the top of base 26a and core 20a'. The film 28 serves as a structural member of the component and, in a preferred embodiment, comprises a flexible member having an adhesive layer on the bottom and a printable layer on the top. Thus, in addition to keeping the pieces of the first electronic component 20' together, the film 28 provides the component manufacturer with a surface for printing indicia, such as product numbers, trademarks, and other desirable information. The film 28 also establishes a generally planar top surface with which the assembly 10 or first electronic component 20', depending on how the assembly is configured (i.e., connected or unconnected configurations), may be picked from conventional tape and reel packaging and placed on a substrate using industry standard vacuum pick-and-place machinery. In a preferred embodiment, film 28 may be a polyimide film, a polyetheretherketone (PEEK) film, a liquid crystal polymer (LCP) film or the like. These and other details regarding film 28 may be found in U.S. Pat. No. 6,914,506 issued Jul. 5, 2005, which is hereby incorporated herein by reference in its entirety.

In the embodiment illustrated in FIGS. 2A-D, the first electronic component 20' has a height of 1 mm, a length and width of 3 mm each, and a receptacle 26d that is 0.72 mm high with an annular inner wall radius of 1.2 mm. Unlike the first electronic component illustrated in FIGS. 1A-B, component 20' has metalized pads 22a'-b' which are connected to the bottom surfaces 26b of base 26. The base 26 of first electronic component 20' also defines ventilation openings 26e-f which allow air to circulate through the assembly 10 and over any additional electronic components disposed within receptacle 26d. In the form illustrated, the ventilation openings 26e-f are formed by leg members extending down from the base 26 and bounded by the bottom surfaces of base 26 and its leg members.

In FIGS. 3A-D, there is illustrated yet another embodiment of the first electronic component 20 of assembly 10 embodying features in accordance with the present invention. In this embodiment, like the embodiment illustrated in FIGS. 2A-D, an outer body or base is used in connection with the electronic component 20, with the outer body or base defining (at least in part) the receptacle into which any additional electronic components are disposed. Unlike the embodiment illustrated in FIGS. 2A-D, however, the core illustrated in the electronic component of FIGS. 3A-D is much larger leaving a smaller sized receptacle into which the additional electronics can be inserted. For convenience, features of alternate embodiments illustrated in FIGS. 3A-D that correspond to features already discussed with respect to FIGS. 1A-B and FIGS. 2A-D are identified using the same reference numeral in combination with an a quotation mark or double prime notation (") merely to distinguish one embodiment form the other, but otherwise such features are similar.

In the embodiment illustrated in FIGS. 3A-D (hereinafter 20"), the electronic component 20" includes a similar structure to that of component 20' in FIGS. 2A-D. For example, component 20" has a base 26" defining an opening or recess 26c" into which at least a portion of core 20a" is disposed and ventilation openings 26e"-f". The base 26" further includes metalized pads 22a"-b" and has a wire (not shown) wound about the reduced diameter center portion of core 20a" and having first and second wire ends which are connected to their respective metalized pads 22a"-b". The base 26" and core 20a" are connected or secured to one another via an adhesive film layer, such as tape 28", which provides a generally flat upper surface for conventional pick-and-place equipment to pick up and place component 20" and preferably provides a surface for providing indicia. Unlike the component 20' of FIGS. 2A-D, however, the core 20a" is much larger, thereby, leaving a smaller sized receptacle for receiving additional electronic components, such as second and third electronic components 30 and 40. For example, in the form illustrated in FIGS. 3A-D, the core 20a" has a height of 0.78 mm as compared to the 0.28 mm height of the core 20a' in FIGS. 2A-D. Thus, with this configuration, the receptacle 26d" of FIGS. 3A-D has a height of 0.22 mm and an annular inner wall radius of 1.2 mm and will only be able to house smaller additional electronic components than component 20'.

An advantage to the structures of FIGS. 2A-D and FIGS. 3A-D over that of FIGS. 1A-B is that the base 28 or 28" can be made of any height desired in order to adjust the size of the receptacle in the first electronic component. Whereas, in the bobbin configuration illustrated in FIGS. 1A-B, the core 20a actually has to be bored out in order to provide the desired receptacle size. Thus, in the embodiments of FIGS.

2A-D and 3A-D, existing core structures may be used rather than requiring special core structures to be built.

It should be understood that the assembly 10, including any of its components, may be made in a variety of shapes and sizes and used to conserve space in a circuit. Thus, in accordance with the present invention, an integrated electronic assembly and method of conserving space in a circuit are provided that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. An integrated electronic assembly comprising:
   a first discrete electronic component having a body and defining a first recess within a bottom surface of the body of the first discrete electronic component, the body forming a side wall extending about at least a majority of the recess and the recess is centered about a vertical axis of the body; and
   a second electronic component comprising an integrated circuit disposed in the first recess of the first electronic component so that the first discrete electronic component is stacked on top of the second electronic component with the side wall of the body extending about a periphery of the second electronic component and collectively the first and second electronic components form an integrated electronic assembly when connected to a substrate to conserve space on the substrate.

2. An integrated electronic assembly according to claim 1 wherein the substrate is a printed circuit board and the first electronic component further defines an opening to provide ventilation to the second electronic component when the integrated electronic assembly is connected to the printed circuit board.

3. An integrated electronic assembly according to claim 1 wherein the first electronic component has a footprint of a specified size for mounting the first electronic component to the substrate and the second electronic component is disposed sufficiently within the first recess of the first electronic component so that the second electronic component may be mounted to the substrate within the footprint of the first electronic component to conserve space on the substrate.

4. An integrated electronic assembly according to claim 1 wherein the first electronic component defines a second recess within the bottom surface of the body of the first electronic component and the assembly further includes a third electronic component at least partially disposed in the second recess of the first electronic component so that the first discrete electronic component is stacked on top of both the first and second electronic components and collectively the first, second and third electronic components form an integrated electronic assembly when connected to the substrate to further conserve space on the substrate.

5. An integrated electronic assembly according to claim 4 wherein the first and second recesses defined by the first electronic component collectively form a single opening in the first electronic component for receiving at least a portion of the second and third electronic components.

6. An integrated electronic assembly according to claim 5 wherein the first electronic component further defines an opening to provide ventilation to the second and third electronic components when the integrated electronic assembly is connected to the substrate.

7. An integrated electronic assembly comprising:
   a coil positioned in an upper portion of the electronic assembly and located in a first horizontal plane; and
   an integrated circuit positioned in a recess that is located in a lower portion of the electronic assembly, the integrated circuit located in a second horizontal plane separate from and parallel to the first horizontal plane, both the coil and integrated circuits having generally flat upper surfaces with which the coil and integrated circuit may be picked and placed on substrate using conventional pick-and-place equipment.

8. An integrated electronic assembly comprising:
   a first discrete electronic component having a body and defining a first recess within a bottom surface of the body of the first discrete electronic component, the body forming a side wall extending about at least a majority of the recess; and
   a second electronic component comprising an integrated circuit disposed in the first recess of the first electronic component so that the first discrete electronic component is stacked on top of the second electronic component with the side wall of the body extending about a periphery of the second electronic component and collectively the first and second electronic components form an integrated electronic assembly when connected to a substrate to conserve space on the substrate.

* * * * *